United States Patent
Lee et al.

(10) Patent No.: US 10,332,939 B2
(45) Date of Patent: Jun. 25, 2019

(54) ORGANIC LIGHT EMITTING DIODE AND LIGHT EMITTING DEVICE INCLUDING THE SAME

(71) Applicant: Samsung Display Co., Ltd., Yongin-si (KR)

(72) Inventors: Sung Hun Lee, Hwaseong-si (KR); Il Soo Park, Yongin-si (KR); Seul Ong Kim, Yongin-si (KR); Hyo Sup Shin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 57 days.

(21) Appl. No.: 15/465,517

(22) Filed: Mar. 21, 2017

(65) Prior Publication Data

US 2017/0330919 A1    Nov. 16, 2017

(30) Foreign Application Priority Data

May 11, 2016 (KR) .......................... 10-2016-0057786

(51) Int. Cl.
| | |
|---|---|
| *H01L 27/32* | (2006.01) |
| *H01L 51/00* | (2006.01) |
| *H01L 51/50* | (2006.01) |
| *H01L 51/52* | (2006.01) |

(52) U.S. Cl.
CPC ...... *H01L 27/3216* (2013.01); *H01L 27/3262* (2013.01); *H01L 51/5056* (2013.01); *H01L 51/5088* (2013.01); *H01L 51/5218* (2013.01); *H01L 51/5234* (2013.01); *H01L 51/5265* (2013.01); *H01L 51/5275* (2013.01); *H01L 51/004* (2013.01); *H01L 51/0035* (2013.01); *H01L 51/0037* (2013.01); *H01L 51/0061* (2013.01); *H01L 51/0072* (2013.01); *H01L 51/0073* (2013.01); *H01L 51/0074* (2013.01); *H01L 51/5271* (2013.01); *H01L 2251/558* (2013.01)

(58) Field of Classification Search
CPC ............ H01L 27/3216; H01L 51/5056; H01L 51/5088
USPC .......................................................... 257/40
See application file for complete search history.

(56) References Cited

U.S. PATENT DOCUMENTS

| | | | |
|---|---|---|---|
| 7,019,331 B2 | 3/2006 | Winters et al. | |
| 7,851,992 B2 | 12/2010 | Lee et al. | |
| 8,771,841 B2 | 7/2014 | Yokoyama et al. | |
| 8,957,442 B2* | 2/2015 | Seo | H01L 27/3209 257/98 |

(Continued)

FOREIGN PATENT DOCUMENTS

| | | |
|---|---|---|
| KR | 10-0721554 | 5/2007 |
| KR | 10-1084197 | 11/2011 |

(Continued)

*Primary Examiner* — Matthew E Warren
(74) *Attorney, Agent, or Firm* — H.C. Park & Associates, PLC

(57) ABSTRACT

An organic light emitting diode includes a first electrode and a second electrode overlapping each other, an emission layer disposed between the first electrode and the second electrode, and a hole transport layer disposed between the first electrode and the emission layer, the hole transport layer having a refractive index in a range of 1.0 to 1.6, in which the organic light emitting diode has a microcavity structure between the first electrode and the second electrode.

18 Claims, 10 Drawing Sheets

(56) References Cited

U.S. PATENT DOCUMENTS

| | | | |
|---|---|---|---|
| 2006/0017377 A1 | 1/2006 | Ryu | |
| 2006/0220542 A1* | 10/2006 | Suh | G02F 1/136286 |
| | | | 313/506 |
| 2007/0269917 A1* | 11/2007 | Hubert | H01L 27/3246 |
| | | | 438/29 |
| 2010/0156280 A1* | 6/2010 | Song | H01L 51/5265 |
| | | | 313/504 |
| 2010/0295445 A1 | 11/2010 | Kuma et al. | |
| 2011/0204342 A1 | 8/2011 | Jeong et al. | |
| 2013/0032840 A1* | 2/2013 | Cho | H01L 51/5212 |
| | | | 257/98 |
| 2013/0193418 A1* | 8/2013 | Ishikawa | H01L 33/08 |
| | | | 257/40 |
| 2015/0008422 A1 | 1/2015 | Lee et al. | |
| 2016/0020416 A1* | 1/2016 | Guimard | H01L 51/5212 |
| | | | 257/40 |
| 2016/0079560 A1* | 3/2016 | Guimard | H01L 51/5237 |
| | | | 257/40 |
| 2016/0079566 A1* | 3/2016 | Sekine | H01L 51/5206 |
| | | | 257/98 |
| 2017/0330919 A1* | 11/2017 | Lee | H01L 27/3216 |

FOREIGN PATENT DOCUMENTS

| | | |
|---|---|---|
| KR | 10-2012-0024624 | 3/2012 |
| KR | 10-2013-0108207 | 10/2013 |
| KR | 10-1544237 | 8/2015 |

* cited by examiner

ORGANIC LIGHT EMITTING DIODE AND LIGHT EMITTING DEVICE INCLUDING THE SAME

CROSS-REFERENCE TO RELATED APPLICATION

This application claims priority from and the benefit of Korean Patent Application No. 10-2016-0057786, filed on May 11, 2016, which is hereby incorporated by reference for all purposes as if fully set forth herein.

BACKGROUND

Field

Exemplary embodiments relate to an organic light emitting diode having improved light-emitting efficiency and a light emitting device including the same.

Discussion of the Background

An organic light emitting diode may emit light when an exciton is stabilized, which may be formed by the combination of holes supplied from an anode and electrons supplied from a cathode in an organic emission layer. The organic light emitting diode has several merits, such as a wide viewing angle, a fast response speed, a thin thickness, and low power consumption, such that the organic light emitting diode is widely applied to various electrical and electronic devices, such as a television, a monitor, a mobile phone, etc. However, since the organic light emitting diode may have low emission efficiency, a high driving voltage may be required to obtain high luminance for the display or as a light, which may shorten a lifespan of elements therein.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode having improved light-emitting efficiency and a light emitting device including the same.

Additional aspects will be set forth in the detailed description which follows, and, in part, will be apparent from the disclosure, or may be learned by practice of the inventive concept.

According to an exemplary embodiment, an organic light emitting diode includes a first electrode and a second electrode overlapping each other, an emission layer disposed between the first electrode and the second electrode, and a hole transport layer disposed between the first electrode and the emission layer, the hole transport layer having a refractive index in a range of 1.0 to 1.6, in which the organic light emitting diode has a microcavity structure between the first electrode and the second electrode.

The first electrode may include a reflecting electrode, and the second electrode may include a transflective electrode.

The microcavity structure may be a primary microcavity structure that satisfies Equation 1:

$$2\pi \cdot q = \sum_j \left( \frac{2\pi 2 n_{j\lambda} d_j}{\lambda} + \delta_j \right) \quad \text{Equation 1}$$

In which, in Equation 1, $n_{j\lambda}$ denotes a refractive index of a $j^{th}$ layer for a wavelength $\lambda$, $d_j$ denotes a thickness of a $j^{th}$ layer, $\delta_j$ denotes a magnitude of a phase variation generated when light passes through the $j^{th}$ layer or is reflected by a reflection surface of the first electrode or the second electrode, and q is 0.

The hole transport layer may contact the first electrode.

A thickness of the hole transport layer may be in a range of 15 nm to 40 nm.

A refractive index of the hole transport layer may be in a range of 1.2 to 1.5.

The refractive index of the hole transport layer may be in a range of 1.2 to 1.45.

The hole transport layer may include a hole-injection layer disposed between the first electrode and the emission layer, and a hole-transporting layer disposed between the hole-injection layer and the emission layer, in which the refractive indices of the hole-injection layer and the hole transfer layer may each be in a range of 1.2 to 1.45.

The emission layer may include a red emission layer, a green emission layer, and a blue emission layer, the red emission layer, the green emission layer, and the blue emission layer may be horizontally disposed in a direction parallel with the first electrode, the hole transport layer may be disposed in common between the red emission layer and the first electrode, between the green emission layer and the first electrode, and between the blue emission layer and the first electrode, and a thickness of the hole transport layer may be the same at common regions.

The emission layer may include layers configured to emit light of different colors, the light of different colors being combined to emit white light.

The layers may have a dual or triple layer structure.

The hole transport layer may include an amine derivative and a perfluoro oligomer.

The hole transport layer may include poly(3,4-ethylenedioxythiophene) polystyrene sulfonate (PEDOT:PSS) or poly(3,4-ethylenedioxythiophene) polystyrene sulfonate perfluorinated ionomer(PEDOT:PSS:PFI).

The organic light emitting diode may have a surface plasmon fraction of 20% or less.

The organic light emitting diode may further include a capping layer disposed on the second electrode.

According to an exemplary embodiment, a light emitting device includes a substrate, a driving thin film transistor disposed on the substrate, and an organic light emitting diode connected to the driving thin film transistor, the organic light emitting diode including a first electrode and a second electrode overlapping each other, an emission layer disposed between the first electrode and the second electrode, and a hole transport layer disposed between the first electrode and the emission layer and having a refractive index that is in a range of 1.0 to 1.6, in which the organic light emitting diode has a microcavity structure between the first electrode and the second electrode.

The first electrode may include a reflecting electrode, and the second electrode may include a transflective electrode.

The first electrode may be disposed between the substrate and the second electrode.

A thickness of the hole transport layer may be in a range of 15 nanometer (nm) to 40 nm.

The microcavity structure may be a primary microcavity structure that satisfies Equation 1:

$$2\pi \cdot q = \sum_j \left( \frac{2\pi 2 n_{j\lambda} d_j}{\lambda} + \delta_j \right) \quad \text{Equation 1}$$

In which, in Equation 1, $n_{j\lambda}$ denotes a refractive index of a $j^{th}$ layer for a wavelength $\lambda$, dj denotes a thickness of a $j^{th}$ layer, $\delta_j$ denotes a magnitude of a phase variation generated when light passes through the $j^{th}$ layer or is reflected by a reflection surface of the first electrode or the second electrode, and q is 0.

According to the exemplary embodiments, light-emitting efficiency of an organic light emitting diode and a light emitting device including the same may be improved by adjusting a refractive index and a thickness of a hole transport layer.

The foregoing general description and the following detailed description are exemplary and explanatory and are intended to provide further explanation of the claimed subject matter.

BRIEF DESCRIPTION OF THE DRAWINGS

The patent or application file contains at least one drawing executed in color. Copies of this patent or patent application publication with color drawings will be provided by the office upon request and payment of the necessary fee.

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
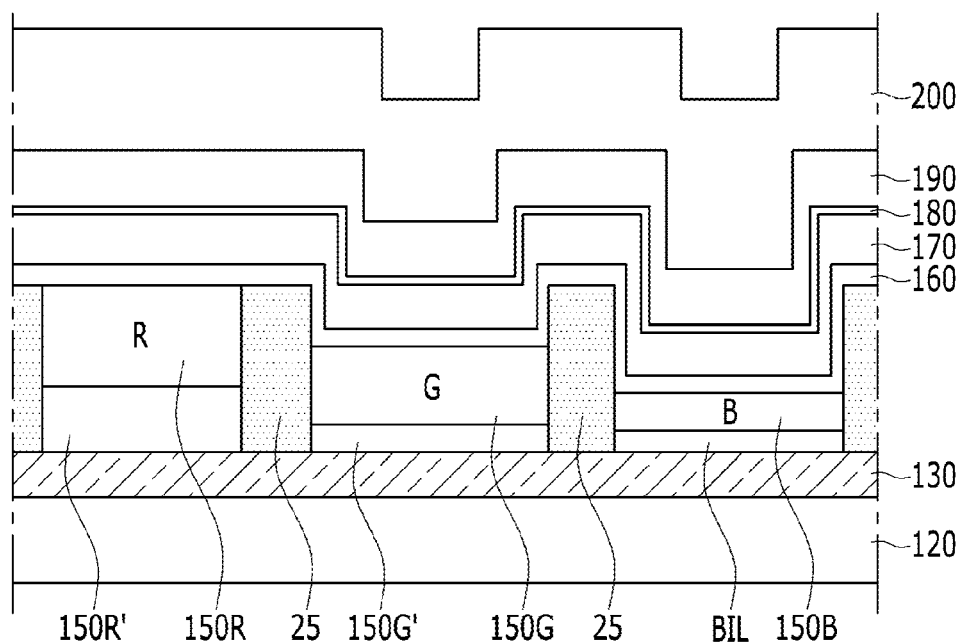
FIG. 1 is a cross-sectional view illustrating an organic light emitting diode according to an exemplary example embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating an organic light emitting diode according to an exemplary embodiment of the present disclosure.

Referring to FIG. 1, the organic light emitting diode includes a first electrode 120 and a second electrode 190 disposed overlapping each other, emission layers 150R, 150G, and 150B disposed between the first electrode 120 and the second electrode 190, a hole transport layer 130 disposed between the first electrode 120 and the emission layers 150R, 150G, and 150B, a buffer layer 160 disposed between the emission layers 150R, 150G, and 150B and the second electrode 190, an electron-transporting layer 170 disposed on the buffer layer 160, an electron-injection layer 180 disposed between the electron-transporting layer 170 and the second electrode 190, and a capping layer 200 disposed on the second electrode 190.

In the present exemplary embodiment, the first electrode 120 may be a reflecting electrode, and the second electrode 190 may be a transflective electrode.

As used herein, the reflecting electrode may be an electrode including a material having a light-reflecting property, which may reflect light emitted from the emission layers 150R, 150G, and 150B to the second electrode 190. For example, such light-reflecting property may include reflecting incident light in a range of about 70% to 100%, or about 80% to about 100%.

The first electrode 120 may contain silver (Ag), aluminum (Al), chromium (Cr), molybdenum (Mo), tungsten (W), titanium (Ti), gold (Au), palladium (Pd), or an alloy thereof, and may have a triple-layer structure of silver (Ag)/indium tin oxide (ITO)/silver (Ag) or indium tin oxide (ITO)/silver (Ag)/indium tin oxide (ITO).

As used herein, the transflective electrode may be an electrode including a material having a transflective property, which may transmit a portion of light incident upon the second electrode 190 and reflect the remaining portion of the light to the first electrode 120. For example, such transflective property may include reflecting incident light in a range of about 0.1% to 70%, or about 30% to about 50%.

The second electrode 190 may include silver (Ag), magnesium (Mg), aluminum (Al), chromium (Cr), molybdenum (Mo), tungsten (W), titanium (Ti), gold (Au), palladium (Pd), or an alloy thereof.

The hole transport layer 130 may be disposed to correspond to an auxiliary layer disposed between the first electrode 120 and the emission layers 150R, 150G, and 150B. Specifically, the hole transport layer 130 may be disposed in common between the red emission layer 150R and the first electrode 120, between the green emission layer 150G and the first electrode 120, and between the blue emission layer 150B and the first electrode 120, and a thickness of the hole transport layer 130 may be the same at common regions thereof.

In the present exemplary embodiment, the hole transport layer 130 may have a refractive index in a range of 1.0 to 1.6, or in a range of 1.2 to 1.5. A wavelength band of light having such refractive index range may include a blue wavelength region, e.g., about 450 nm.

The hole transport layer 130 may contact the first electrode 120, and a thickness thereof may be in a range of about 15 to 40 nm. When the thickness of the hole transport layer 130 is in this range, a surface plasmon fraction, which will be described later, may be equal to or smaller than 50%. The surface plasmon may be a material disposed on a surface of a metal, which includes electrons that vibrate. As used herein, a surface plasmon fraction may refer to a degree to which excitons of the organic light emitting diode disappear by a surface plasmon mode to be described later.

The hole transport layer 130 may include at least one of the hole-injection layer and the hole-transporting layer. The hole injection layer may facilitate injection of holes from the first electrode 120, and the hole-transporting layer may smoothly transport the holes transmitted from the hole injection layer. In this case, refractive indices of the hole-injection layer and the hole-transporting layer may each be in a range of 1.0 to 1.6, or in a range of 1.2 to 1.5, or in a range of 1.2 to 1.45. The hole transport layer 130 may have a dual-layered structure, in which the hole transport layer is disposed on the hole injection layer, or a single layer structure including mixed materials forming the hole injection layer and the hole-transporting layer.

The hole transport layer 130 may include perfluoro oligomer, or a material forming the hole-injection layer or the hole-transporting layer that is well known in the art. The perfluoro oligomer may reduce a refractive index of the hole transport layer 130.

The perfluoro oligomer may be a compound that includes a repeating unit represented as Chemical Formula A and a repeating unit represented as Chemical Formula B.

In the present exemplary embodiment, the perfluoro oligomer may have a molecular weight of about 1500 or less in order to perform vacuum evaporation.

Chemical Formula A

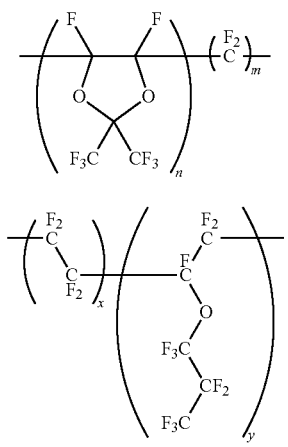

Chemical Formula B

In Chemical Formula A and Chemical Formula B, n, m, x, and y are natural numbers, and may be determined such that the molecular weight of the perfluoro oligomer is about 1500 or less.

The material constituting the hole-injection layer or the hole-transporting layer may include an aromatic amine derivative that may be represented as one of Chemical Formulae 1 to 5.

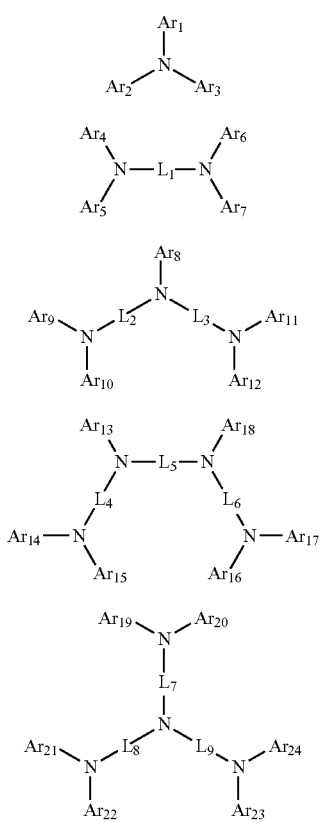

Chemical Formula 1

Chemical Formula 2

Chemical Formula 3

Chemical Formula 4

Chemical Formula 5

In Chemical Formulae 1 to 5, each of $Ar_1$ to $Ar_{24}$ may refer to a substituted or unsubstituted ring-forming C6 to C50 aryl group, or a substituted or unsubstituted ring-forming Z5 to Z50 heteroaryl group. As used herein, "Zn", where n is a natural number, denotes the number of atoms forming the ring.

Each of $L_1$ to $L_9$ may refer to a substituted or unsubstituted ring-forming C6 to C50 arylene group or a substituted or unsubstituted ring-forming Z5 to Z50 heteroarylene group. As used herein, "Zn", where n is a natural number, may denote the number of atoms forming the ring.

Possible substituents of $Ar_1$ to $Ar_{24}$ and $L_1$ to $L_9$ are a C1 to C15 straight or branched alkyl group, a ring-forming C3 to C15 cycloalkyl group, a trialkylsilyl group having a C1 to C15 straight or branched alkyl group, a triaryl silyl group having a ring-forming C6 to C14 aryl group, an alkyl aryl silyl group having a C1 to C15 straight or branched alkyl group and a ring-forming C6 to C14 aryl group, a ring-forming C6 to C50 aryl group, a ring-forming Z5 to Z50 heteroaryl group, a halogen atom, or a cyano group. As used herein, "Zn", where n is a natural number, may denote the number of atoms forming the ring. A plurality of substituents that are adjacently disposed may be combined to form a ring-forming saturated or unsaturated divalent group.

At least one of $Ar_1$ to $Ar_{24}$ may be a substituent represented by any one of Chemical Formulae 6 and 7.

Chemical Formula 6

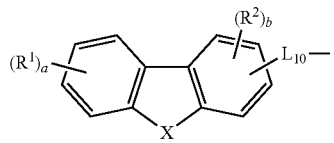

Chemical Formula 7

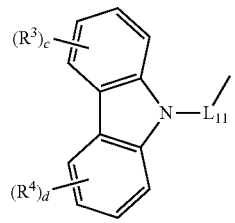

In Chemical Formula 6, X may be an oxygen atom, a sulfur atom, or N—Ra, Ra may be a C1 to C15 straight or branched alkyl group, a ring-forming C3 to C15 cycloalkyl group, a ring-forming C6 to C50 aryl group, or a ring-forming Z5 to Z50 heteroaryl group, and $L_{10}$ may be a single-bonded, substituted or unsubstituted ring-forming C6 to C50 arylene group, or a substituted or unsubstituted ring-forming Z5 to Z50 heteroarylene group. As used herein, "Zn", where n is a natural number, may denote the number of atoms forming the ring.

In Chemical Formula 7, $L_{11}$ may be a substituted or unsubstituted ring-forming C6 to C50 arylene group or a substituted or unsubstituted ring-forming Z5 to Z50 heteroarylene group. As used herein, "Zn", where n is a natural number, may denote the number of atoms forming the ring.

In Chemical Formulae 6 and 7, each of $R^1$ to $R^4$ may be a C1 to C15 straight or branched alkyl group, a ring-forming C3 to C15 cycloalkyl group, a trialkylsilyl group having a C1 to C15 straight or branched alkyl group, a triaryl silyl group having a ring-forming C6 to C14 aryl group, an alkyl aryl silyl group having a C1 to C15 straight or branched alkyl group and a ring-forming C6 to C14 aryl group, a ring-forming C6 to C14 aryl group, a ring-forming Z5 to Z50 heteroaryl group, a halogen atom, or a cyano group. As used herein, "Zn", where n is a natural number, may denote the number of atoms forming the ring. Further, a plurality of $R^1$ to $R^4$ that are adjacently disposed may be combined to form a ring. In addition, a, c, and d may each be an integer in a range of 0 to 4, and b may be an integer in a range of 0 to 3.

A compound represented as Chemical Formula 1 may be a compound represented as Chemical Formula 8.

Chemical Formula 8

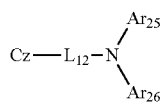

In Chemical Formula 8, Cz may be a substituted or unsubstituted carbazolyl group.

$L_{12}$ may be a substituted or unsubstituted ring-forming C6 to C50 arylene group, or a substituted or unsubstituted ring-forming Z5 to Z50 heteroarylene group. Each of $Ar_{25}$ and $Ar_{26}$ indicates a substituted or unsubstituted ring-forming C6 to C50 aryl group, or a substituted or unsubstituted ring-forming Z5 to Z50 heteroaryl group. As used herein, "Zn", where n is a natural number, may denote the number of atoms forming the ring.

A compound represented as Chemical Formula 8 may be a compound represented as Chemical Formula 9.

Chemical Formula 9

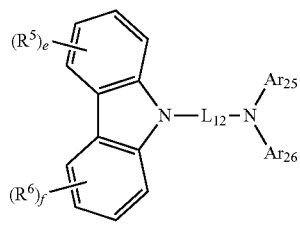

In Chemical Formula 9, each of $R^5$ and $R^6$ may be a C1 to C15 straight or branched alkyl group, a ring-forming C3 to C15 cycloalkyl group, a trialkylsilyl group having a C1 to C15 straight or branched alkyl group, a triaryl silyl group having a ring-forming C6 to C14 aryl group, an alkyl aryl silyl group having a C1 to C15 straight or branched alkyl group and a ring-forming C6 to C14 aryl group, a ring-forming C6 to C14 aryl group, a ring-forming Z5 to Z50 heteroaryl group, a halogen atom, or a cyano group. As used herein, "Zn", where n is a natural number, may denote the number of atoms forming the ring. Further, a plurality of $R^5$ and $R^6$ that are adjacently disposed may be combined to form a ring. In addition, e and f may each be an integer in a range of 0 to 4. $L_{12}$, $Ar_{25}$, and $Ar_{26}$ respectively correspond to $L_{12}$, $Ar_{25}$, and $Ar_{26}$ in Chemical Formula 8.

A compound represented as Chemical Formula 9 may be a compound represented as Chemical Formula 10.

Chemical Formula 10

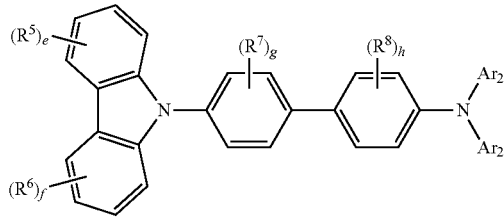

In Chemical Formula 10, each of $R^7$ and $R^8$ indicates a C1 to C15 straight or branched alkyl group, a ring-forming C3 to C15 cycloalkyl group, a trialkylsilyl group having a C1 to C15 straight or branched alkyl group, a triaryl silyl group having a ring-forming C6 to C14 aryl group, an alkyl aryl silyl group having a C1 to C15 straight or branched alkyl group and a ring-forming C6 to C14 aryl group, a ring-forming C6 to C14 aryl group, a ring-forming Z5 to Z50 heteroaryl group, a halogen atom, or a cyano group. As used herein, "Zn", where n is natural number, may denote the number of atoms forming the ring. Further, a plurality of $R^5$ and $R^6$ that are adjacently disposed may be combined to form a ring. In addition, g and h may each be an integer in a range of 0 to 4. $R^5$, $R^6$, e, f, $Ar_{25}$, and $Ar_{26}$ respectively correspond to $R^5$, $R^6$, e, f, $Ar_{25}$, and $Ar_{26}$ in Chemical Formula 9.

The hole transport layer 130 may alternatively include poly(3,4-ethylenedioxythiophene) polystyrene sulfonate (PEDOT:PSS) or PEDOT:PSS:PFI. Herein, PFI may be a perfluorinated ionomer, which is Nafion® developed by DuPont Company.

Hereinabove, the material of the hole transport layer 130 has been described. However, when the hole transport layer 130 includes a hole-injection layer and a hole-transporting layer, each of the hole-injection layer and the hole-transporting layer may include the aforementioned material of the hole transport layer 130.

The emission layers 150R, 150G, and 150B disposed on the hole transport layer 130 include a red emission layer 150R, a green emission layer 150G, and a blue emission layer 150B, which are horizontally disposed in a direction parallel with an upper surface of the first electrode 120. A pixel definition layer 25 may be disposed between adjacent emission layers 150R, 150G, and 150B.

In the present exemplary embodiment, an auxiliary layer BIL may be disposed below the blue emission layer 150B to increase efficiency of the blue emission layer 150B. The auxiliary layer BIL may increase the efficiency of the blue emission layer 150B by adjusting a hole charge balance. The auxiliary layer BIL may include a compound represented by Chemical Formula 11.

Chemical Formula 11

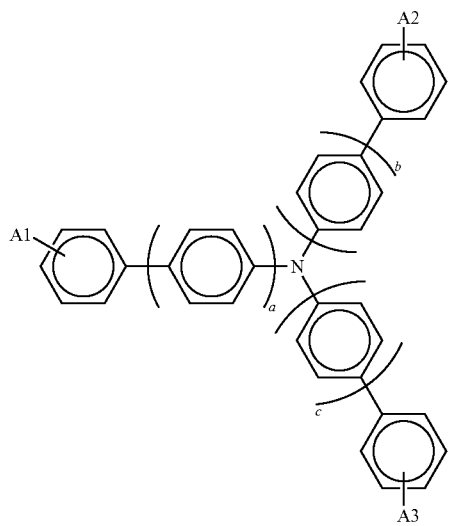

In Chemical Formula 11, each of A1, A2, and A3 may be hydrogen, an alkyl group, an aryl group, carbazolyl group, dibenzothiophenyl group, dibenzofuryl group (DBF), or biphenyl group, and each of a, b, and c may be in a range of 0 to 4.

Examples of the compound represented as Chemical Formula 11 may include compounds represented as Chemical Formulae 11-1, 11-2, 11-3, 11-4, 11-5, and 11-6.

Chemical Formula 11-1

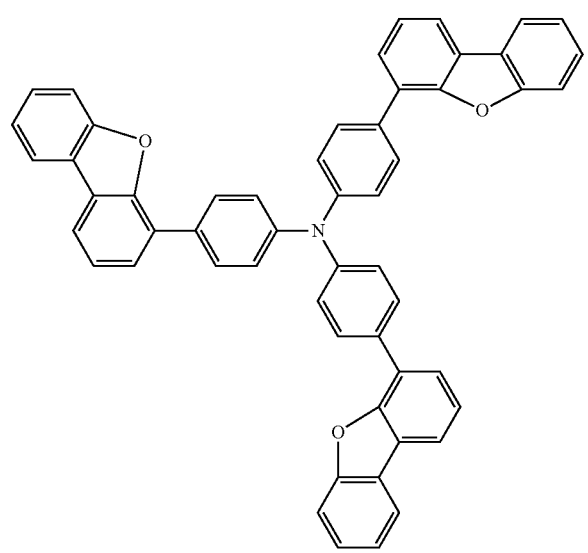

Chemical Formula 11-2

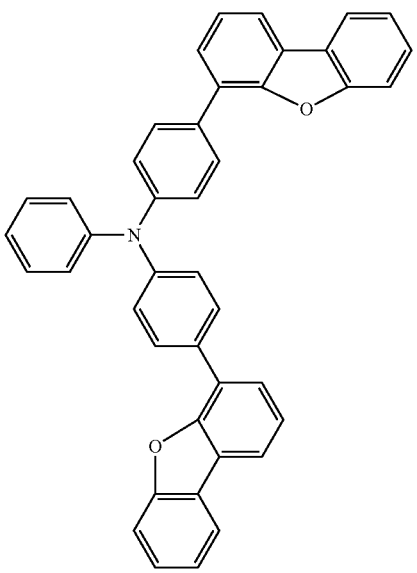

Chemical Formula 11-3

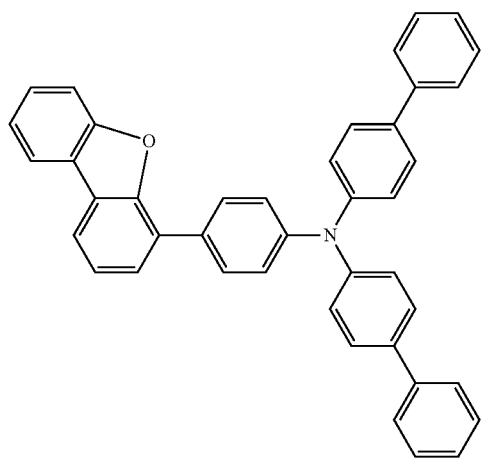

Chemical Formula 11-4

Chemical Formula 11-5

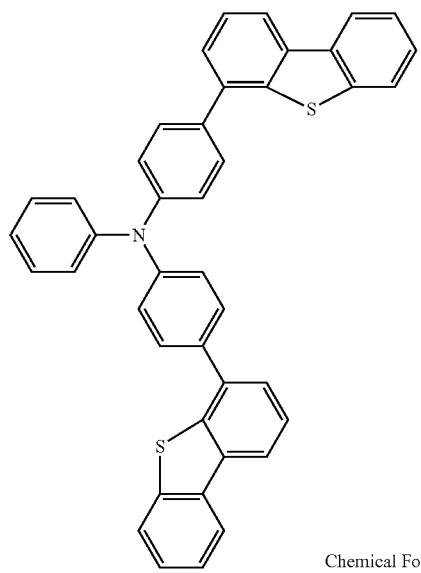

Chemical Formula 11-6

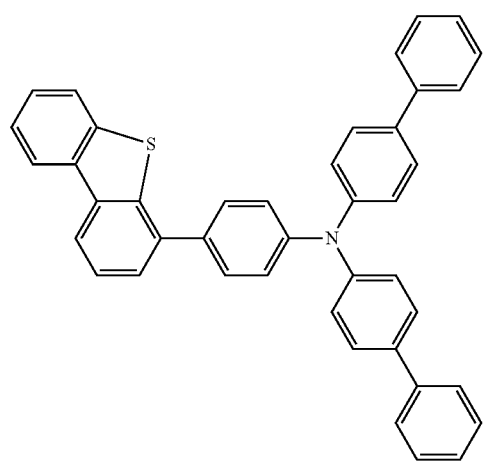

According to an exemplary embodiment, the auxiliary layer BIL may include a compound represented as Chemical Formula 12.

Chemical Formula 12

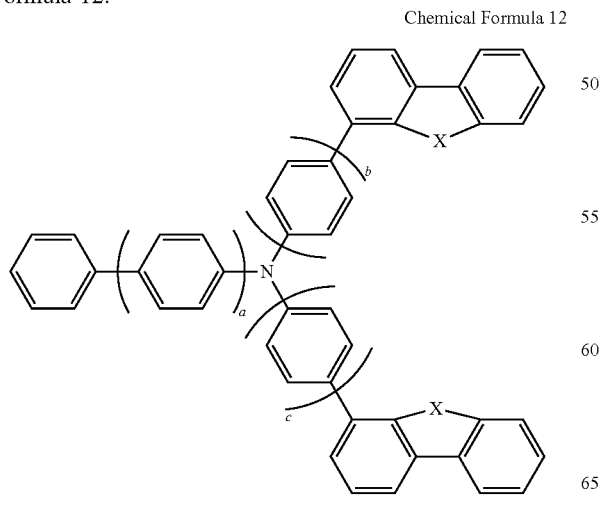

In Chemical Formula 12, each of a, b, and c may be in a range of 0 to 3, X may be one of O, N, and S, and a plurality of Xs may be the same as or different from each other.

Examples of the compound represented as Chemical Formula 12 may include compounds represented as Chemical Formulae 12-1 to 12-5.

Chemical Formula 12-1

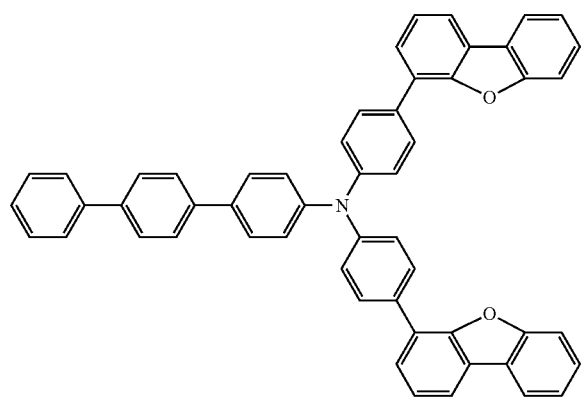

Chemical Formula 12-2

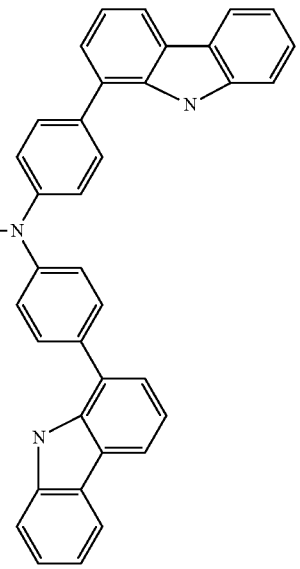

Chemical Formula 12-3

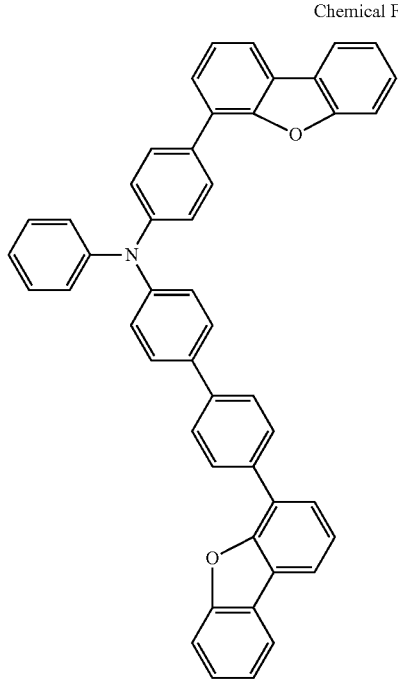

Chemical Formula 12-4

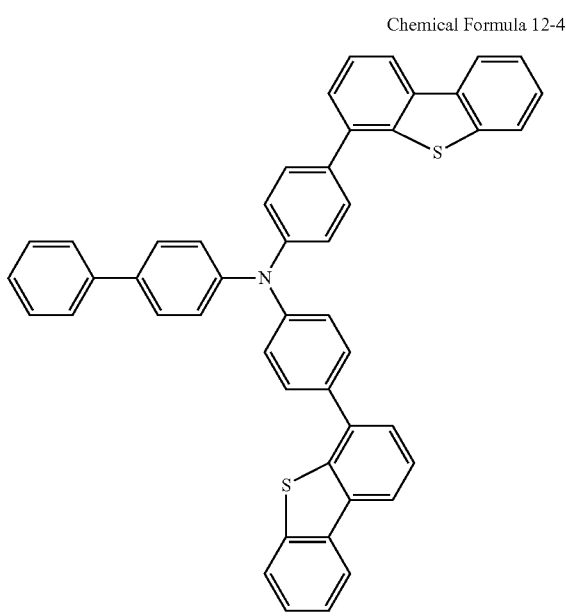

Chemical Formula 12-5

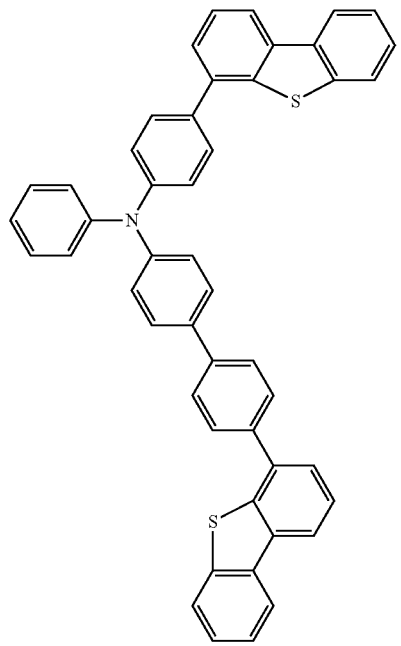

According to an exemplary embodiment, the auxiliary layer BIL may include a compound represented as Chemical Formula 13.

Chemical Formula 13

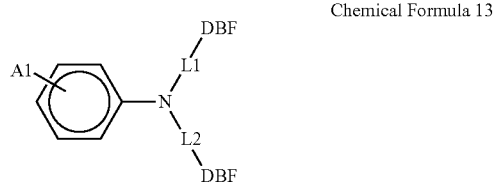

In Chemical Formula 13, A1 may be hydrogen, an alkyl group, an aryl group, carbazolyl group, dibenzothiophenyl group, or dibenzofuryl group (DBF), each of L1 and L2 may represented by Chemical Formula 14, and the DBF connected with L1 and L2 may be replaced with carbazolyl group or dibenzothiophenyl group.

Chemical Formula 14

In Chemical Formula 14, n may be an integer in a range of 0 to 3.

In the organic light emitting diode according to the present exemplary embodiment, a red resonance auxiliary layer 150R' may be disposed under the red emission layer 150R, and a green resonance auxiliary layer 150G' may be disposed under the green emission layer 150G. The red resonance auxiliary layer 150R' and the green resonance auxiliary layer 150G' may control a resonance distance for each color. In contrast, a separate resonance auxiliary layer may not be disposed between the blue emission layer 150B/auxiliary layer BIL and the hole transport layer 130.

Each of the emission layers 150R, 150G, and 150B includes a host and a dopant. Materials forming the emission layers 150R, 150G, and 150B are not particularly restricted.

The red emission layer 150R includes a host material that includes CBP (carbazole biphenyl) or mCP (1,3-bis(carbazol-9-yl)benzene), and may be formed of a phosphorescent material including at least one of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (platinum octaethylporphyrin), or a fluorescent material including PBD:Eu(DBM)$_3$(phen) or perylene.

The green emission layer 150G includes a host material including CBP or mCP, and may be formed of a phosphorescent material including a dopant material including Ir(ppy)$_3$ (fac-tris(2-phenylpyridine)iridium) or a fluorescent material including Alq$_3$(tris(8-hydroxyquinolino)aluminum), but is not limited thereto.

The blue emission layer 150B includes a host material including CBP or mCP, and may be made of a phosphorescent material including a dopant that includes (4,6-F$_2$ppy)$_2$Irpic. Alternatively, the blue emission layer 150B may include the host material having an anthracene group, and may be made of a fluorescent material including the dopant including a diamine group or at least one of spiro-DPVBi, spiro-6P, distyrylbenzene (DSB), distyrylarylene (DSA), a PFO-based polymer, and a PPV-based polymer, but is not limited thereto.

The buffer layer 160, the electron-transporting layer 170, and the electron-injection layer 180 may be disposed on the emission layers 150R, 150G, and 150B. The buffer layer 160 may serve as a hole-blocking layer, but may alternatively be omitted.

The electron-transporting layer 170 may include an organic material. For example, the electron-transporting layer 170 may include at least one of Alq$_3$ (tris(8-hydroxyquinolino)aluminum), PBD (2-[4-biphenyl-5-[4-tert-butylphenyl]]-1,3,4-oxadiazole), TAZ (1,2,4-triazole), spiro-PBD (spiro-2-[4-biphenyl-5-[4-tert-butylphenyl]]-1,3,4-oxadiazole), and BAlq (8-hydroxyquinoline aluminum salt), however is not limited thereto. The electron-transporting layer 170 may include a metal.

The electron injection layer 180 may improve electron injection from the second electrode 190 to the electron-transporting layer 170. In the present exemplary embodiment, the electron-injection layer 180 may include a metal having a work function of about 4.0 eV or less. For example, the metal may include at least one of Li, Na, K, Rb, Cs, Ca, Sr, Ba, Ce, Sm, Eu, Gd, La, Nd, Tb, Lu, Yb, and Mg.

The capping layer 200 disposed on the second electrode 190 may induce a change in resonance intensity and resonance phase in cooperation with the second electrode 190. The capping layer 200 may include an inorganic material or an organic material having a refractive index that is in a range of about 1.80 to 1.90. The capping layer 200 may include Alq3.

According to the present exemplary embodiment, the organic light emitting diode may have a microcavity structure between the first electrode 120 and the second electrode 190 in order to improve light-emitting efficiency. The microcavity structure may satisfy Equation 1.

$$2\pi \cdot q = \sum_j \left( \frac{2\pi 2 n_{j\lambda} d_j}{\lambda} + \delta_j \right) \quad [\text{Eq. 1}]$$

In Equation 1, $n_{j\lambda}$ denotes a refractive index of a $j^{th}$ layer for a wavelength $\lambda$, dj denotes a thickness of a $j^{th}$ layer, $\delta_j$ denotes a magnitude of a phase variation generated when light passes through the $j^{th}$ layer or is reflected by a reflection surface included in the first electrode 120 or the second electrode 190, and q is an integer, such as 0, 1, 2, etc.

In the present exemplary embodiment, in the microcavity structure, a resonance distance of light emitted from the emission layers 150R, 150G, and 150B may be a distance between the first electrode 120 and the second electrode 190. However, when the first electrode 120 has a triple-layer structure including indium tin oxide (ITO)/silver (Ag)/indium tin oxide (ITO), the resonance distance may be a distance between the second electrode 190 and a layer formed of silver (Ag) included in the first electrode 120. Accordingly, a refractive index and thickness condition of a layer formed of indium tin oxide (ITO) disposed at an uppermost end of the first electrode 120 should be considered in Equation 1.

In Equation 1, the hole transport layer 130 may be formed to include a material having a high refractive index, by reducing a physical thickness of the hole transport layer 130 while refractive indices and thicknesses of other layers are fixed. Herein, a standard high refractive index may be a refractive index of about 1.7 or more. In this case, the physical thickness of the hole transport layer 130 may be reduced to improve a yield and facilitate mass production.

However, when a hole transport layer 130 having the high refractive index is applied to an organic light emitting diode having a primary microcavity structure, light-emitting efficiency is reduced by 60% as compared to a secondary microcavity structure. Herein, in the case of the primary microcavity structure, the value of q in Equation 1 is 0, and in the case of the secondary microcavity structure, the value of q in Equation 1 is 1.

The reason for reduction of light-emitting efficiency in an organic light emitting diode having the primary microcavity structure, in which the hole transport layer thereof has the high refractive index, is because, when the refractive index of the hole transport layer is increased, the thickness of the hole transport layer is generally reduced, and thus, a quenching phenomenon of which excitons spread to a surface plasmon of an electrode may occur.

The organic light emitting diode according to the present exemplary embodiment described above may reduce the quenching phenomenon of the excitons by using a hole transport layer having a relatively low refractive index to improve the light-emitting efficiency. The quenching phenomenon of the excitons may refer to a state where exitons are not discharged in a form of light energy but disappear by the surface plasmon of the electrode.

Hereinafter, effects of an improved light-emitting efficiency according to an exemplary embodiment of the present disclosure will be described.

Figure 2:
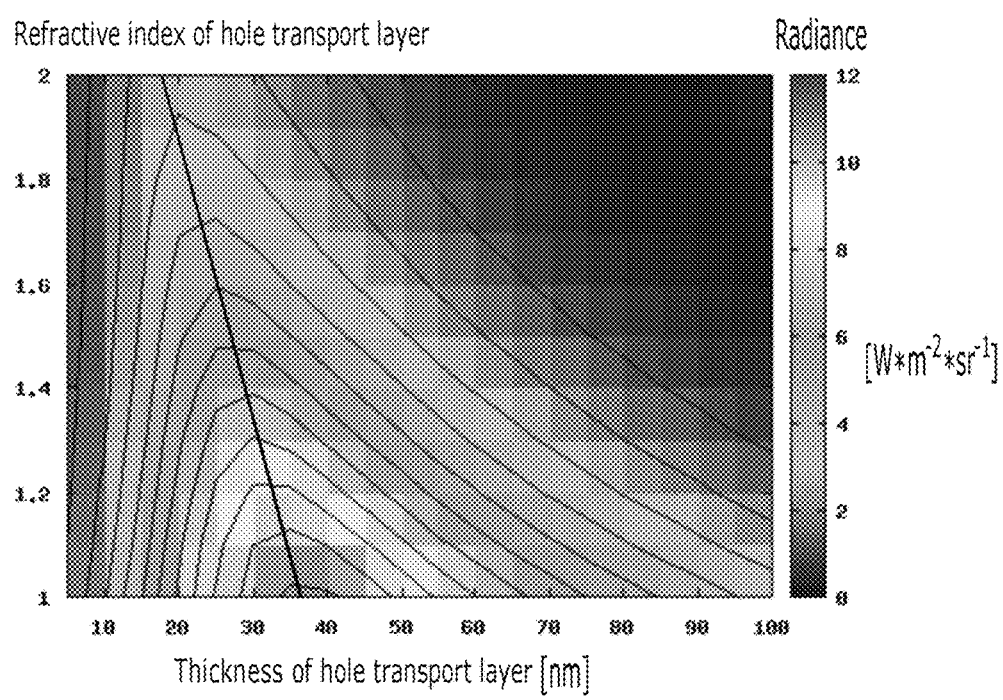
FIG. 2 is a graph illustrating radiance according to a refractive index and a thickness of a hole transport layer.
Figure 3:
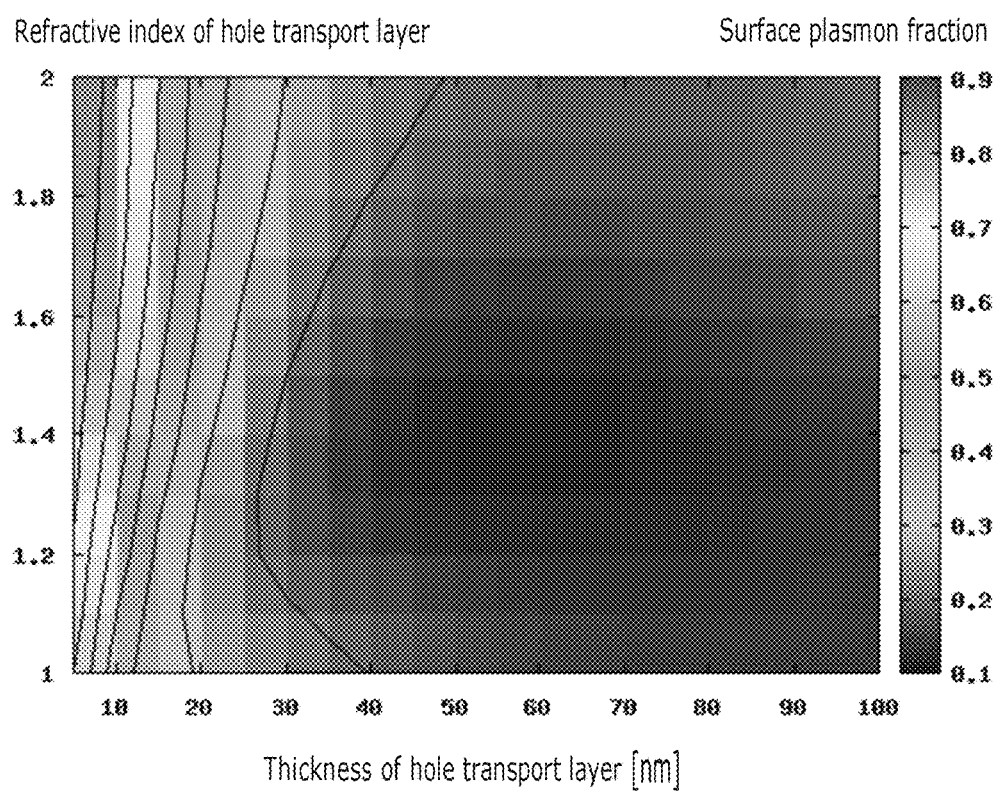
FIG. 3 is a graph illustrating a surface plasmon fraction according to a refractive index and a thickness of a hole transport layer.

FIG. 2 is a graph illustrating radiance according to a refractive index and a thickness of a hole transport layer. FIG. 3 is a graph illustrating a surface plasmon fraction according to a refractive index and a thickness of a hole transport layer.

Referring to FIG. 2, a connecting line schematically connecting a peak of contour lines along the y-axis direction may be a thickness and a refractive index of the hole transport layer that satisfies a primary resonance condition. In this case, when the refractive index is changed from 2 to 1 based on the connecting line, radiance emitted toward a front of the organic light emitting diode is increased by about two times. Herein, the front of the organic light emitting diode may be a direction from the first electrode 120 toward the second electrode 190 of the organic light emitting diode of FIG. 1.

Referring to FIG. 3, in the surface plasmon fraction according to the thickness and the refractive index of the hole transport layer, a surface plasmon fraction is sharply reduced as the refractive index of the hole transport layer is reduced. Accordingly, the hole transport layer having a thin thickness with the primary microcavity structure may have an increased current efficiency by the sharply reduced quenching of the excitons formed in the emission layer.

Figure 4:
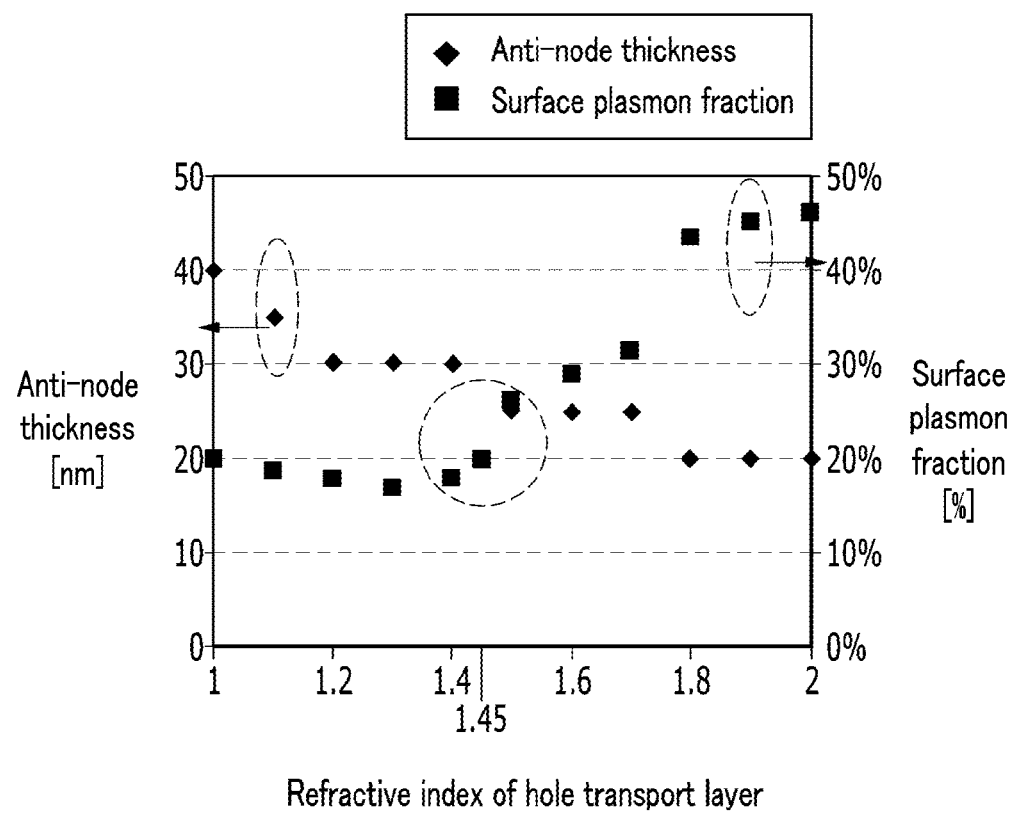
FIG. 4 is a graph illustrating an anti-node thickness and a surface plasmon fraction according to a refractive index of a hole transport layer.

FIG. 4 is a graph illustrating an anti-node thickness and a surface plasmon fraction according to a refractive index of a hole transport layer.

In FIG. 4, the anti-node thickness may be a thickness for emitting light with a maximum amount toward the front direction according to the refractive index of the hole transport layer. The front direction may be a direction from the first electrode 120 toward the second electrode 190 of the organic light emitting diode of FIG. 1. Herein, the hole transport layer may include a hole-injection layer and a hole-transporting layer, and it is assumed that the hole-injection layer and the hole-transporting layer have the same refractive index.

Referring to FIG. 4, a large inflection point of the surface plasmon fraction is found when the refractive index of the hole transport layer is in a range of about 1.7 to 1.8, and the surface plasmon fraction is further reduced when the refractive index is in a range of about 1.5 to 1.7. Further, a large inflection point of the surface plasmon fraction is found when the refractive index is in a range of about 1.4 to 1.5, and a surface plasmon fraction of similar magnitude is found when the refractive index is in a range of about 1.0 to 1.4.

Accordingly, light-emitting efficiency towards the front direction may be increased by setting the refractive index of the hole transport layer in a range of about 1.0 to 1.6 and the thickness of the hole transport layer in a range of 15 nm to 40 nm.

The refractive index of the hole transport layer may be in a range of about 1.2 to 1.5, or 1.2 to 1.45, in order to improve the light-emitting efficiency towards the front direction. When the refractive index of the hole transport layer is in a range of about 1.2 to 1.45, the surface plasmon fraction is equal to or smaller than 20%, and in this case, the anti-node thickness is in a range of about 25 nm to 30 nm.

Figure 5:
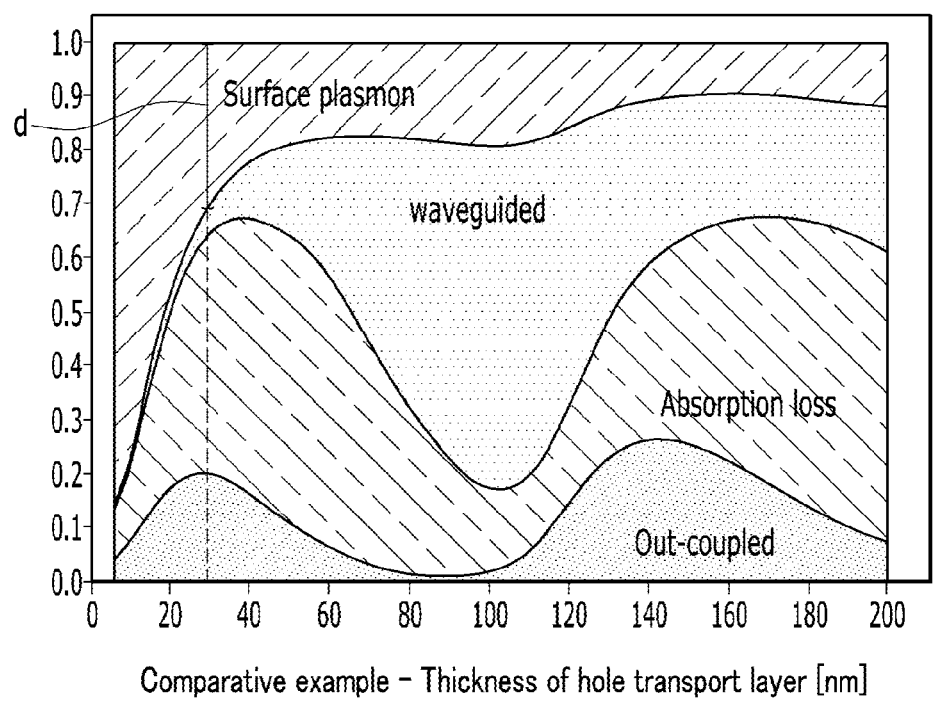
FIG. 5 is a graph illustrating relative average contributions in four modes according to a thickness of a hole transport layer in a comparative embodiment.
Figure 6:
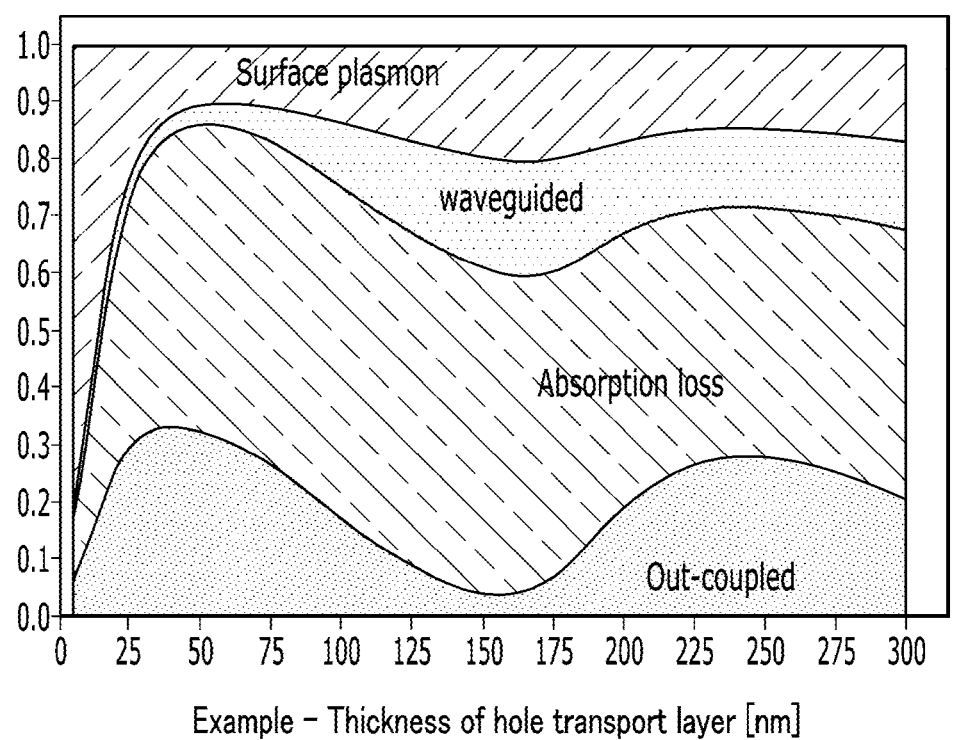
FIG. 6 is a graph illustrating relative average contributions in four modes according to a thickness of a hole transport layer according to an exemplary embodiment of the present disclosure.

FIG. 5 is a graph illustrating relative average contributions in four modes according to a thickness of a hole transport layer in a comparative embodiment. FIG. 6 is a graph illustrating relative average contributions in four modes according to a thickness of a hole transport layer in an exemplary embodiment of the present disclosure.

In FIG. 5 and FIG. 6, the relative average contributions show where excitons generated in an emission layer are moved to and how they are changed.

In FIG. 5 and FIG. 6, the four modes include a surface plasmon mode, a wave-guided mode, an absorption loss mode, and an out-coupled mode. In the surface plasmon mode, the excitons are moved to a surface plasmon of an electrode, thereby generating the quenching phenomenon. In the wave-guided mode, excitons are changed to photons, but are confined within the organic light emitting diode. In the absorption loss mode, excitons are changed to photons, but disappear by being absorbed by an electrode, an emission layer, and the like. In the out-coupled mode, excitons leak to the front of the organic light emitting diode.

In the comparative embodiment illustrated with reference to FIG. 5, the hole transport layer is formed by using an amine derivative having a refractive index of about 1.7 or more. In the exemplary embodiment illustrated with reference to FIG. 6, the hole transport layer having a refractive index of about 1.4 is formed by using a perfluoro oligomer, PEDOT:PSS, or PEDOT:PSS:PFI, described above.

In FIG. 5 and FIG. 6, when a line is drawn based on a thickness of the hole transport layer in the y-axis direction, lengths of regions occupied in each mode may indicate a fraction of each mode. For example, a first length "d" shown in FIG. 5 indicates that the fraction of the surface plasmon mode is 30% for a hole transport layer having a 30 nm thickness.

Referring to FIG. 5 and FIG. 6, in the comparative embodiment of FIG. 5, the fraction of the surface plasmon mode is in a range of about 20% to 60% when the thickness of the hole transport layer is in a range of 15 nm to 40 nm. Referring to FIG. 6, however, the fraction of the surface plasmon mode is in a range of about 12% to 44% when the thickness of the hole transport layer is in a range of 15 nm to 50 nm. A fraction of the out-coupled mode for the same thickness range is in a range of about 10% to 20% in the comparative embodiment and about 20% to 30% in the exemplary embodiment. Accordingly, by using the hole transport layer having a relatively low refractive index according to the exemplary embodiment, the light-emitting efficiency is increased.

Figure 7:
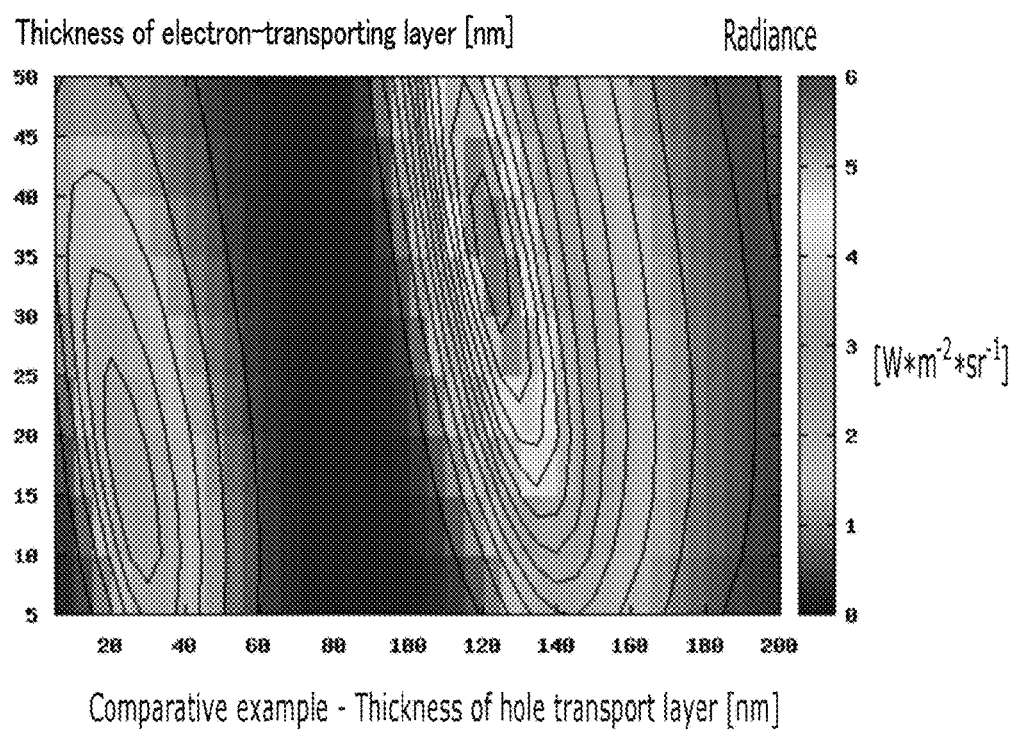
FIG. 7 is a graph illustrating radiance depending on thicknesses of a hole transport layer and an electron-transporting layer in a comparative embodiment.
Figure 8:
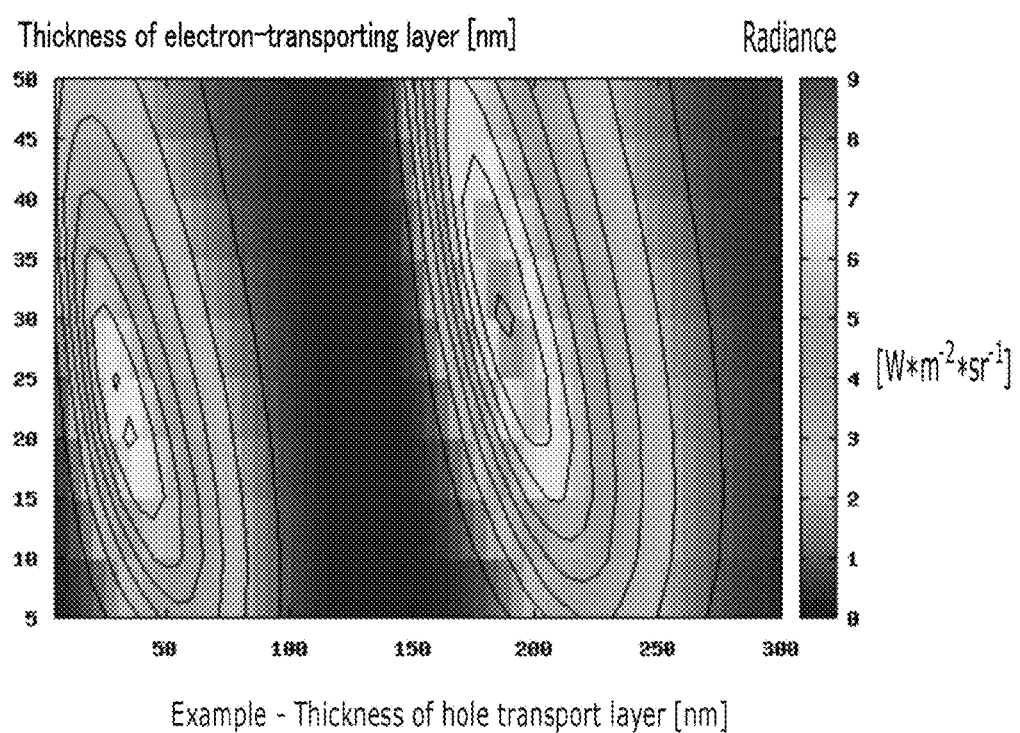
FIG. 8 is a graph illustrating radiance according to thicknesses of a hole transport layer and an electron-transporting layer according to an exemplary embodiment of the present disclosure.

FIG. 7 is a graph illustrating radiance according to thicknesses of a hole transport layer and an electron-transporting layer in a comparative embodiment. FIG. 8 is a graph illustrating radiance according to thicknesses of a hole transport layer and an electron-transporting layer according to an exemplary embodiment of the present disclosure.

In the comparative embodiment illustrated with reference to FIG. 7, the hole transport layer includes an amine derivative having a refractive index of about 1.7 or more. In the exemplary embodiment illustrated with reference to FIG. 8, the hole transport layer having a refractive index of about 1.4 is formed by using a perfluoro oligomer, PEDOT:PSS, or PEDOT:PSS:PFI, described above.

In FIG. 7 and FIG. 8, a left contour line may be a radiance in the primary microcavity structure, and a right contour line may be a radiance in the secondary microcavity structure.

Referring to FIG. 7, the highest radiance in the secondary microcavity structure is about $6[W*m^{-2}*sr^{-1}]$, and the highest radiance in the primary microcavity structure is about $3[W*m^{-2}*sr^{-1}]$. A difference therebetween is about $3[W*m^{-2}*sr^{-1}]$. Referring to FIG. 8, the highest radiance in the secondary microcavity structure is about $7.5[W*m^{-2}*sr^{-1}]$, and the highest radiance in the primary microcavity structure is about $7[W*m^{-2}*sr^{-1}]$. A difference therebetween about $0.5[W*m^{-2}*sr^{-1}]$. Accordingly, when the hole transport layer has a relatively low refractive index, a degree by which the light-emitting efficiency is reduced as compared to the secondary microcavity structure is reduced, and the light-emitting efficiency itself is increased. Further, there is a radiance increasing effect of about $1.5[W*m^{-2}*sr^{-1}]$, when the hole transport layer according the exemplary embodiment is applied to the secondary microcavity structure, as compared to the comparative embodiment.

Efficiency and a driving voltage of the comparative embodiment and the exemplary embodiment described above will be described with reference to Table 1. A detailed structure of the comparative embodiment will be described with reference to FIG. 1.

The organic light emitting diode according to the comparative embodiment includes: the first electrode 120 of about 200 Å and the second electrode 190 of about 200 Å disposed to overlap each other; the red emission layer 150R of about 450 Å, the green emission layer 150G of about 400 Å, and the blue emission layer 150B of about 160 Å disposed between the first electrode 120 and the second electrode 190; the red resonance auxiliary layer 150R' of about 260 Å, the green resonance auxiliary layer 150G' of about 70 Å, and the auxiliary layer BIL disposed below the red emission layer 150R, the green emission layer 150G, and the blue emission layer 150B, respectively; the hole transport layer 130 of about 150 Å disposed between the first electrode 120 and the emission layers 150R, 150G, and 150B; the buffer layer 160 of about 50 Å disposed between the emission layers 150R, 150G, and 150B and the second electrode 190; the electron-transporting layer 170 of about 180 Å disposed on the buffer layer 160; the electron-injection layer 180 of about 13 Å disposed between the electron-transporting layer 170 and the second electrode 190; and the capping layer 200 of about 650 Å disposed on the second electrode 190. A structure of the exemplary embodiment is substantially the same as that of the comparative embodiment, except that the refractive index of the hole transport layer 130 is lower than that of the comparative embodiment, and the thickness thereof is 230 Å.

TABLE 1

|  |  | CE(cd/A) | Driving voltage (V) |
|---|---|---|---|
| Comparative Embodiment | Red | 38 | 4.0 |
|  | Green | 125 | 4.0 |
|  | Blue | 6.1 | 3.1 |
|  | White | 40 | — |
| Exemplary Embodiment | Red | 45.2 | 4.0 |
|  | Green | 150 | 4.0 |
|  | Blue | 8.2 | 3.1 |
|  | White | 51.8 | — |

Referring to Table 1, red light-emitting efficiency, green light-emitting efficiency, and blue light-emitting efficiency are respectively increased by 10% or more, 20% or more, and 30% or more as compared with the comparative embodiment, when the same driving voltage are applied to the exemplary embodiment and the comparative embodiment. Further, white power consumption is reduced by 20% in the exemplary embodiment as compared with in the comparative embodiment.

Figure 9:
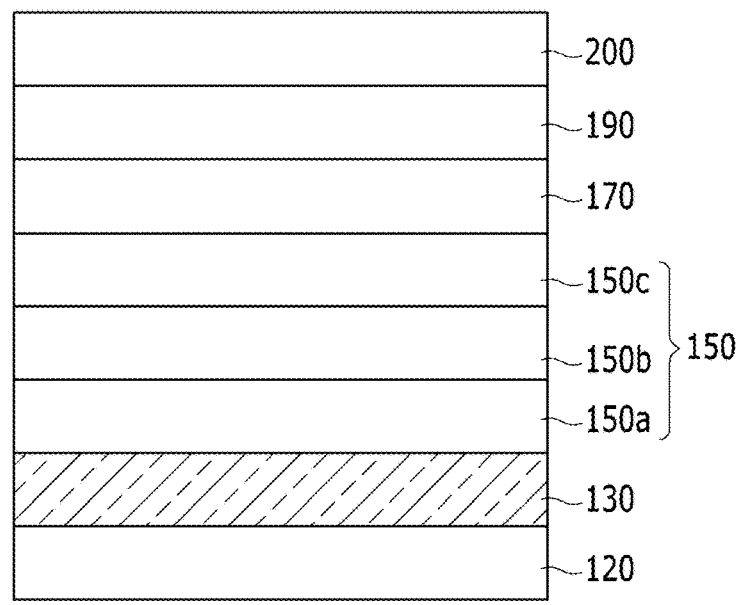
FIG. 9 is a cross-sectional view illustrating an organic light emitting diode including an emission layer including a plurality of layers according to an exemplary embodiment of the present disclosure.

FIG. 9 is a cross-sectional view illustrating an organic light emitting diode including an emission layer including a plurality of layers according to an exemplary embodiment of the present disclosure.

The configurations of the organic light emitting diode illustrated with reference to FIG. 9 are substantially the same as those of the organic light emitting diode illustrated with reference to FIG. 1. As such, differences elements or configuration therebetween will be described, and the elements previously described with reference to FIG. 1 may be applied to the exemplary embodiment illustrated with reference to FIG. 9.

Referring to FIG. 9, the buffer layer 160 of FIG. 1 may be omitted. The organic light emitting diode according to the present exemplary embodiment of FIG. 9 includes an emission layer 150 emitting white light, by combining light of different colors from a plurality of layers 150a, 150b, and 150c. FIG. 9 shows that the emission layer 150 includes three layers 150, 150b, and 150c, however, the number of layers emitting light of different colors may be varied.

Three layers of the emission layer 150 may respectively represent blue, yellow, and blue colors. Alternatively, the emission layer 150 may include two layers respectively representing blue and yellow colors. Although not shown, at least one charge generating layer may be disposed between adjacent layers 150a, 150b, and 150c of FIG. 9.

The hole transport layer 130 in FIG. 9 may be substantially the same as the hole transport layer 130 of FIG. 1, and thus, repeated description thereof will be omitted.

Figure 10:
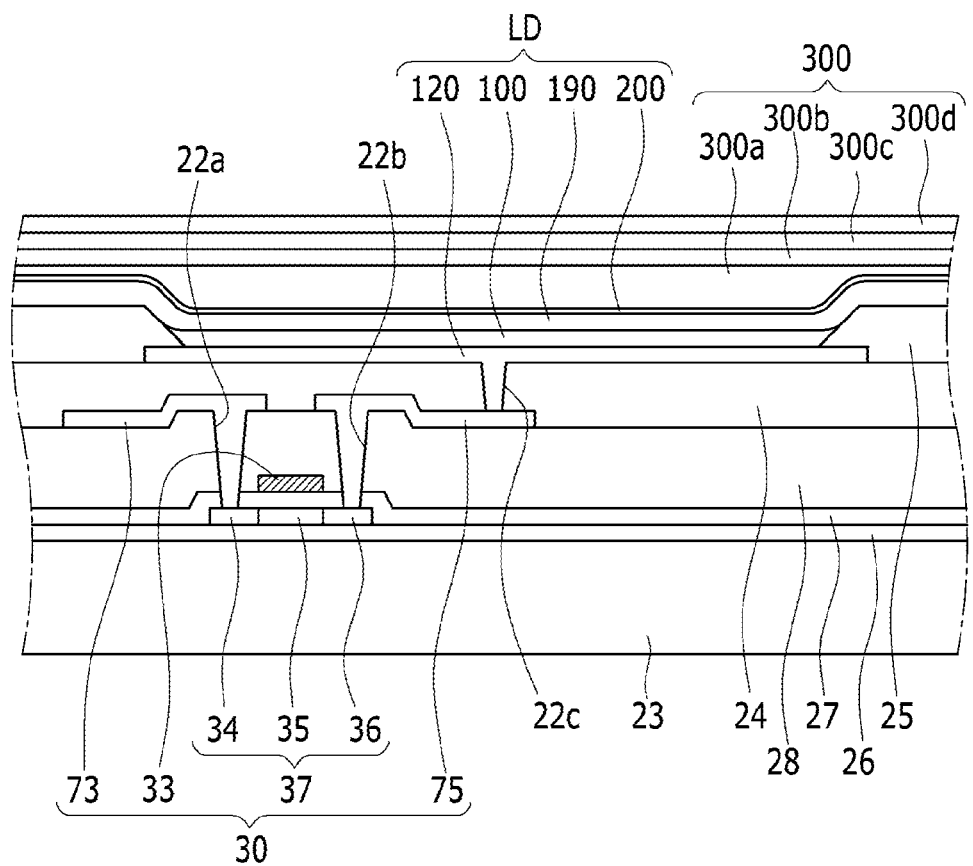
FIG. 10 is a cross-sectional view illustrating a light emitting device according to an exemplary embodiment of the present disclosure.

FIG. 10 is a cross-sectional view illustrating a light emitting device according to an exemplary embodiment of the present disclosure.

Referring to FIG. 10, the light emitting device diode display according to the present exemplary embodiment includes a substrate 23, a driving thin film transistor 30, a first electrode 120, a light-emitting diode layer 100, and a second electrode 190. The first electrode 120 may be an anode and the second electrode 190 may be a cathode, or the first electrode 120 may be a cathode and the second electrode 190 may be an anode.

A substrate buffer layer 26 may be disposed on the substrate 23. The substrate buffer layer 26 may prevent penetration of impurities and planarize the surface thereof. Alternatively, the substrate buffer layer 26 may be omitted according to a type and process conditions of the substrate 23.

A driving semiconductor layer 37 is disposed on the substrate buffer layer 26. The driving semiconductor layer 37 may be formed of a material including a polysilicon. Further, the driving semiconductor layer 37 includes a channel region 35 not doped with an impurity, and a source region 34 and a drain region 36 doped with an impurity may be disposed at opposing sides of the channel region 35. The doped ion materials may be P-type impurities such as boron (B), and $B_2H_6$ may be generally used. The impurities may depend on the type of the driving thin film transistor.

A gate insulating layer 27 is disposed on the driving semiconductor layer 37. A gate wire including a driving gate electrode 33 is disposed on the gate insulating layer 27. The driving gate electrode 33 is formed to overlap at least a portion of the driving semiconductor layer 37, particularly, the channel region 35.

An interlayer insulating layer 28 covering the driving gate electrode 33 is disposed on the gate insulating layer 27. A first contact hole 22a and a second contact hole 22b that expose the source region 34 and the drain region 36 of the driving semiconductor layer 37 are formed in the gate insulating layer 27 and the interlayer insulating layer 28. A data wire including a driving source electrode 73 and a driving drain electrode 75 may be disposed on the interlayer insulating layer 28. The driving source electrode 73 and the driving drain electrode 75 are connected to the source region 34 and the drain region 36 of the driving semiconductor layer 37 through the first contact hole 22a and the second contact hole 22b formed in the interlayer insulating layer 28 and the gate insulating layer 27, respectively.

As described above, the driving thin film transistor 30 including the driving semiconductor layer 37, the driving gate electrode 33, the driving source electrode 73, and the driving drain electrode 75 is formed. The configuration of the driving thin film transistor 30 is not limited to the aforementioned example, and may be variously modified as generally known in the art.

In addition, a planarization layer 24 covering the data wire is formed on the interlayer insulating layer 28. The planarization layer 24 may remove a step and planarize the surface thereof to increase emission efficiency of the organic light emitting diode to be formed thereon. Further, the planarization layer 24 has a third contact hole 22c to electrically connect the driving drain electrode 75 and the first electrode 120 that will be described later. One of the planarization layer 24 and the interlayer insulating layer 28 may be omitted.

A first electrode 120 of the organic light emitting diode LD is disposed on the planarization layer 24. A pixel definition layer 25 is disposed on the planarization layer 24 and the first electrode 120. The pixel definition layer 25 has an opening overlapping a part of the first electrode 120. The light-emitting diode layer 100 may be disposed for each opening formed in the pixel definition layer 25.

The light-emitting diode layer 100 is disposed on the first electrode 120. The light-emitting diode layer 100 corresponds to the hole transport layer 130, the emission layers 150R, 150G and 150B, the buffer layer 160, the electron-transporting layer 170, and the electron injection layer 180 of the organic light emitting diode described with reference to FIG. 1.

A second electrode 190 and a capping layer 200 are disposed on the light-emitting diode layer 100. The capping layer 200 may cover and protect the second electrode 190. The capping layer 200 may induce a change in resonance intensity and resonance phase in cooperation with the second electrode 190. The capping layer 200 may be formed of an inorganic material or an organic material having a refractive index in a range of about 1.80 to 1.90.

In the present exemplary embodiment, all the descriptions with reference to FIG. 1 are applicable to the organic light emitting diode LD.

A thin film encapsulation layer 300 is disposed on the capping layer 200. The thin film encapsulation layer 300 encapsulates the organic light emitting diode LD and the driving circuit unit formed on the substrate 23 from the outside for protection.

The thin film encapsulation layer 300 includes encapsulation organic layers 300a and 300c and encapsulation inorganic layers 300b and 300d that are alternately stacked with each other. In FIG. 10, the thin film encapsulation layer 300 is configured by alternately depositing two encapsulation organic layers 300a and 300c and two encapsulation inorganic layers 300b and 300d one by one, but is not limited thereto.

Although the aforementioned organic light emitting diode has been described to be applied to the light emitting device with reference to FIG. 10, the organic light emitting diode according to the present exemplary embodiment is applicable to a lighting device as well as a display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light emitting diode, comprising:
a first electrode and a second electrode overlapping each other;
an emission layer disposed between the first electrode and the second electrode; and
a hole transport layer disposed between the first electrode and the emission layer, the hole transport layer having a refractive index in a range of 1.0 to 1.6,
wherein the organic light emitting diode has a microcavity structure between the first electrode and the second electrode,
wherein the microcavity structure comprises a primary microcavity structure that satisfies Equation 1:

$$2\pi \cdot q = \sum_{j} \left( \frac{2\pi 2 n_{j\lambda} d_j}{\lambda} + \delta_j \right)$$ [Equation 1]

wherein $n_{j\lambda}$ denotes a refractive index of a $j^{th}$ layer for a wavelength $\lambda$, $d_j$ denotes a thickness of a $j^{th}$ layer, $\delta_j$ denotes a magnitude of a phase variation generated when light passes through the $j^{th}$ layer or is reflected by a reflection surface of the first electrode or the second electrode, and q is 0.

2. The organic light emitting diode of claim 1, wherein the first electrode comprises a reflecting electrode, and the second electrode comprises a transflective electrode.

3. The organic light emitting diode of claim 1, wherein the hole transport layer contacts the first electrode.

4. The organic light emitting diode of claim 1, wherein a thickness of the hole transport layer is in a range of 15 nm to 40 nm.

5. The organic light emitting diode of claim 1, wherein a refractive index of the hole transport layer is in a range of 1.2 to 1.5.

6. The organic light emitting diode of claim 5, wherein the refractive index of the hole transport layer is in a range of 1.2 to 1.45.

7. The organic light emitting diode of claim 1, wherein:
the hole transport layer comprises:
a hole-injection layer disposed between the first electrode and the emission layer; and
a hole-transporting layer disposed between the hole-injection layer and the emission layer; and
the refractive indices of the hole-injection layer and the hole-transporting layer are each in a range of 1.2 to 1.45.

8. The organic light emitting diode of claim 1, wherein:
the emission layer comprises a red emission layer, a green emission layer, and a blue emission layer;
the red emission layer, the green emission layer, and the blue emission layer are horizontally disposed in a direction parallel with the first electrode;
the hole transport layer is disposed in common between the red emission layer and the first electrode, between the green emission layer and the first electrode, and between the blue emission layer and the first electrode; and
a thickness of the hole transport layer is the same at common regions.

9. The organic light emitting diode of claim 1, wherein the emission layer comprises layers configured to emit light of different colors, the light of different colors being combined to emit white light.

10. The organic light emitting diode of claim 9, wherein the layers of the emission layer have a dual or triple layer structure.

11. The organic light emitting diode of claim 1, wherein the hole transport layer comprises an amine derivative and a perfluoro oligomer.

12. The organic light emitting diode of claim 1, wherein the organic light emitting diode has a surface plasmon fraction of 20% or less.

13. The organic light emitting diode of claim 1, further comprising a capping layer disposed on the second electrode.

14. An organic light emitting diode, comprising:
a first electrode and a second electrode overlapping each other;
an emission layer disposed between the first electrode and the second electrode; and
a hole transport layer disposed between the first electrode and the emission layer, the hole transport layer having a refractive index in a range of 1.0 to 1.6 and comprising poly(3,4-ethylenedioxythiophene) polystyrene sulfonate or poly(3,4-ethylenedioxythiophene) polystyrene sulfonate perfluorinated ionomer,
wherein the organic light emitting diode has a microcavity structure between the first electrode and the second electrode.

15. A light emitting device comprising:
a substrate;
a thin film transistor disposed on the substrate; and
an organic light emitting diode connected to the thin film transistor, the organic light emitting diode comprising:
a first electrode and a second electrode overlapping overlap each other;
an emission layer disposed between the first electrode and the second electrode; and
a hole transport layer disposed between the first electrode and the emission layer and having a refractive index in a range of 1.0 to 1.6,
wherein the organic light emitting diode has a microcavity structure between the first electrode and the second electrode,
wherein the microcavity structure is a primary microcavity structure that satisfies Equation 1:

$$2\pi \cdot q = \sum_j \left( \frac{2\pi 2 n_{j\lambda} d_j}{\lambda} + \delta_j \right)$$ [Equation 1]

wherein $n_{j\lambda}$ denotes a refractive index of a $j^{th}$ layer for a wavelength $\lambda$, $d_j$ denotes a thickness of a $j^{th}$ layer, $\delta_j$ denotes a magnitude of a phase variation generated when light passes through the $j^{th}$ layer or is reflected by a reflection surface of the first electrode or the second electrode, and q is 0.

16. The light emitting device of claim 15, wherein the first electrode comprises a reflecting electrode, and the second electrode comprises a transflective electrode.

17. The light emitting device of claim 16, wherein the first electrode is disposed between the substrate and the second electrode.

18. The light emitting device of claim 15, wherein a thickness of the hole transport layer is in a range of 15 nm to 40 nm.

* * * * *